(12) United States Patent
Daniel

(10) Patent No.: US 12,439,202 B2
(45) Date of Patent: Oct. 7, 2025

(54) AUDIO DEVICE WITH ANC AND HEAR-THROUGH

(71) Applicant: GN Audio A/S, Ballerup (DK)

(72) Inventor: John Yoahann Daniel, Ballerup (DK)

(73) Assignee: GN AUDIO A/S, Ballerup (DK)

( * ) Notice: Subject to any disclaimer, the term of this patent is extended or adjusted under 35 U.S.C. 154(b) by 284 days.

(21) Appl. No.: 18/347,782

(22) Filed: Jul. 6, 2023

(65) Prior Publication Data

US 2024/0015436 A1     Jan. 11, 2024

(30) Foreign Application Priority Data

Jul. 8, 2022   (EP) ..................................... 22183941

(51) Int. Cl.
H04R 3/02     (2006.01)

(52) U.S. Cl.
CPC ........... *H04R 3/02* (2013.01); *H04R 2460/01* (2013.01)

(58) Field of Classification Search
CPC .............................. H04R 3/02; H04R 2460/01
USPC ......... 381/71.1, 71.6, 71.8, 71.11, 71.14, 95, 381/119
See application file for complete search history.

(56) References Cited

U.S. PATENT DOCUMENTS

| | | | |
|---|---|---|---|
| 10,129,633 B1 * | 11/2018 | Patil ................. | G08B 13/19663 |
| 2014/0126733 A1 * | 5/2014 | Gauger, Jr. ........ | G10K 11/1783 |
| | | | 381/71.6 |
| 2017/0193978 A1 * | 7/2017 | Goldman ......... | G10K 11/17881 |
| 2019/0130928 A1 * | 5/2019 | Rule ................ | G10K 11/17837 |
| 2020/0374629 A1 * | 11/2020 | Pyatt ......................... | H04R 3/02 |
| 2020/0380945 A1 | 12/2020 | Woodruff et al. | |
| 2021/0304725 A1 | 9/2021 | Kannan et al. | |
| 2022/0164160 A1 * | 5/2022 | Laaksonen ........... | H04R 1/1083 |

FOREIGN PATENT DOCUMENTS

WO          2021185891 A1     9/2021

OTHER PUBLICATIONS

The extended European search report issued in European Application No. 22183941.8, dated Dec. 19, 2022.

* cited by examiner

*Primary Examiner* — Paul Kim
*Assistant Examiner* — Con P Tran
(74) *Attorney, Agent, or Firm* — HSML P. C.

(57) ABSTRACT

An audio device comprising an interface with a receiver with an output sound based on an audio output signal; a feed-forward microphone; a distributor for provision of a first feed-forward input signal and a second feed-forward input signal; a feed-back microphone; a feed-forward filter for provision of a feed-forward output signal; an intermediate filter module, wherein the intermediate filter module comprises a hear-through filter based on the second feed-forward input signal and wherein the intermediate filter module is configured to provide the intermediate signal based on the hear-through signal and the audio input signal; a first mixer for provision of an error signal based on the feed-back input signal and the intermediate signal; a feed-back filter signal based on the error signal; and a second mixer for provision of the audio output signal based on the feed-forward output signal and the feed-back output signal.

15 Claims, 2 Drawing Sheets

AUDIO DEVICE WITH ANC AND HEAR-THROUGH

FIELD

The present disclosure relates generally to an audio device, in particular audio devices for improving audio quality and intelligibility, e.g. in voice pick-up.

BACKGROUND

Active noise cancellation and hear-through processing play a continuously increasing role in audio processing and in particular in audio devices in the search for improved user experience and superior sound quality in changing environments and audio conditions.

SUMMARY

There is a need for audio devices which can improve audio quality and intelligibility.

Also, there is a need for audio devices which may mitigate, alleviate, or address the existing shortcomings, for example by improving audio quality and/or functionality in an audio device.

An audio device is disclosed, the audio device comprising an interface for provision of an audio input signal based on one or more audio signals received from an auxiliary device; a receiver for provision of an output sound into an ear canal of a user based on an audio output signal; a feed-forward microphone for provision of a feed-forward input signal based on ambient sound; a distributor for provision of a first feed-forward input signal and a second feed-forward input signal each based on the feed-forward input signal; a feed-back microphone for provision of a feed-back input signal based on the output sound and a noise sound in or at the ear canal of the user; a feed-forward filter for provision of a feed-forward output signal based on the first feed-forward input signal, wherein the feed-forward filter is representative of an acoustic signal path from the feed-forward microphone to the ear canal of the user; an intermediate filter module for provision of an intermediate signal representative of a desired sound to be reproduced by the receiver, wherein the intermediate filter module comprises a hear-through filter for provision of a hear-through signal based on the second feed-forward input signal and wherein the intermediate filter module is configured to provide the intermediate signal based on the hear-through signal and the audio input signal; a first mixer for provision of an error signal based on the feed-back input signal and the intermediate signal; a feed-back filter for provision of a feed-back output signal representative of noise sound picked up at the feed-back microphone, the feed-back output signal based on the error signal; and a second mixer for provision of the audio output signal based on the feed-forward output signal and the feed-back output signal.

Further, a method of operating an audio device is disclosed, the method comprising obtaining a feed-forward input signal and a feed-back input signal; obtaining an audio input signal; distributing the feed-forward input signal for provision of a first feed-forward input signal and a second feed-forward input signal based on the feed-forward input signal; processing, such as filtering, the first feed-forward input signal for provision of a feed-forward output signal; processing, such as filtering and/or mixing, the second feed-forward input signal and/or the audio input signal for provision of an intermediate signal; wherein processing the second feed-forward input signal and the audio input signal optionally comprises filtering the second feed-forward input signal for provision of a second feed-forward output signal and providing the intermediate signal based on the second feed-forward output signal and the audio input signal; mixing the feed-back input signal and the intermediate signal for provision of an error signal; processing, such as filtering, the error signal for provision of a feed-back output signal; mixing the feed-forward output signal and the feed-back output signal for provision of an audio output signal; and providing an output sound based on the audio output signal.

The present disclosure provides an audio device providing improved audio quality of audio signals and allows for improved awareness of surroundings for a user via optimized hear-through processing.

It is an advantage of the present disclosure that increased modality in the audio processing is provided to accommodate changing audio conditions and listening needs for the user.

Advantageously, the present disclosure provides audio devices with a generic and adaptive audio processing for provision of improved audio adapted to changing active noise cancellation (ANC) and hear-through requirements. In particular, separate filter controls allow for flexible and highly customizable audio processing without, or with heavily reduced, complex filter computations.

BRIEF DESCRIPTION OF THE DRAWINGS

The above and other features and advantages of the present disclosure will become readily apparent to those skilled in the art by the following detailed description of exemplary embodiments thereof with reference to the attached drawings, in which.

DETAILED DESCRIPTION

Figure 1:
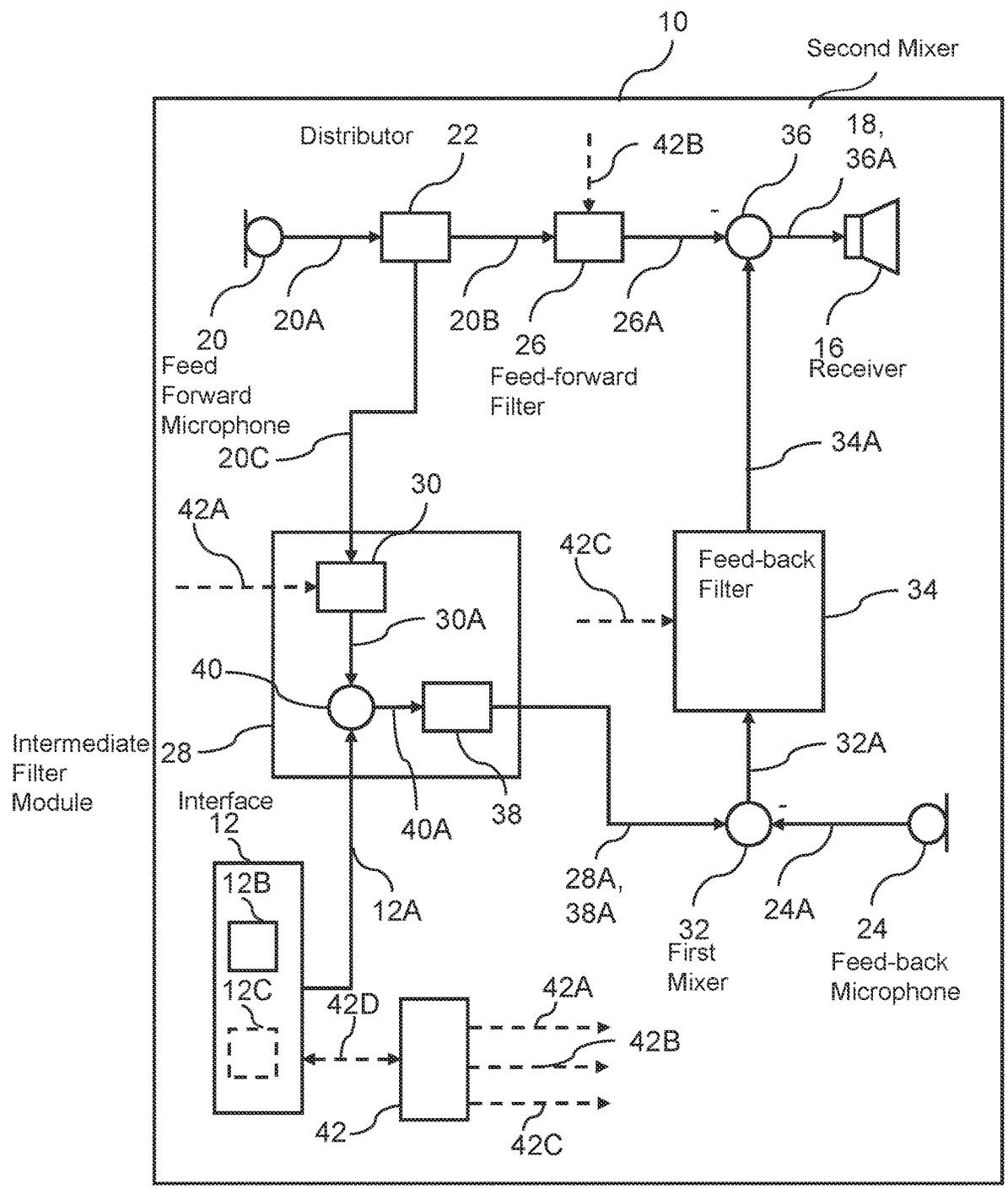
FIG. 1 illustrates an example audio device according to the disclosure.

Various exemplary embodiments and details are described hereinafter, with reference to the figures when relevant. It should be noted that the figures may or may not be drawn to scale and that elements of similar structures or functions are represented by like reference numerals throughout the figures. It should also be noted that the figures are only intended to facilitate the description of the embodiments. They are not intended as an exhaustive description of the invention or as a limitation on the scope of the invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

Disclosed herein are examples of audio devices. Audio devices may be one or more of: headsets, audio signal processors, headphones, computers, mobile phones, tablets, servers, microphones, speakers, software, and applications. The audio device may be a single audio device. The audio device may be a plurality of interconnected audio devices, such as a system. The audio device may be configured to process audio. The audio device can be configured to output audio. The audio device can be configured to obtain, such as receive, audio.

Advantageously, the disclosed audio devices can be used for all form factors in all types of environments, such as for headsets. For example, the audio device may not have a specific microphone placement requirement. The audio device can utilize an adaptation ability to output high quality speech and intelligibility.

The audio device comprises an interface for provision of an audio input signal based on one or more audio signals received from an auxiliary device; a receiver for provision of an output sound into an ear canal of a user based on an audio output signal; a feed-forward microphone for provision of a feed-forward input signal based on ambient sound; a distributor for provision of a first feed-forward input signal and a second feed-forward input signal each based on the feed-forward input signal; and a feed-back microphone for provision of a feed-back input signal based on the output sound and a noise sound in or at the ear canal of the user.

The interface may comprise a wireless receiver, a wireless transceiver, or a connector, e.g. for forming a respective wireless or wired connection to an auxiliary device. The interface may comprise one or more buttons and/or touch sensors for receiving user input.

In one or more example audio devices, the interface comprises a wireless transceiver also denoted radio transceiver and an antenna for wireless reception and/or transmission. The audio device may be configured for wireless communication with one or more auxiliary devices, such as with another audio device and/or with one or more accessory devices, such as one or more of a smartphone, a tablet computer and/or a smart watch. The audio device optionally comprises an antenna for converting one or more wireless input audio signals to audio input signal. The wireless input audio signal(s) may origin from one or more accessory devices, such as one or more of a smartphone, a tablet computer and/or a smart watch.

The feed-forward microphone may also be denoted an ambient microphone or first microphone. The feed-forward microphone is arranged to pick up ambient sound when the audio device is in use and arranged in or at a user's ear.

Optionally, the audio device comprises a distributor for provision of a first feed-forward input signal and a second feed-forward input signal each based on the feed-forward input signal. In other words, the distributor may be configured to distribute the feed-forward input signal to a plurality of modules, elements or processing units, and/or element. Thus, the first feed-forward input signal and the second feed-forward input signal may be a copy of or the same as the feed-forward input signal.

The feed-back microphone may also be denoted an in-canal microphone or second microphone. The feed-back microphone may be arranged to pick up in-canal sound when the audio device is in use and arranged in or at a user's ear.

The audio device comprises a feed-forward filter for provision of a feed-forward output signal, e.g. based on the first feed-forward input signal, wherein the feed-forward filter is optionally representative of an acoustic signal path from the feed-forward microphone to the ear canal of the user. In other words, the feed-forward filter may receive the feed-forward input signal or the first feed-forward input signal as input and filter the (first) feed-forward input signal for provision of the feed-forward output signal as an output of the feed-forward filter.

The audio device comprises an intermediate filter module, e.g. for provision of an intermediate signal representative of a desired sound to be reproduced by the receiver. The intermediate filter module comprises a hear-through filter for provision of a hear-through signal based on the feed-forward input signal or the second feed-forward input signal. The intermediate filter module may be configured to, e.g. using a mixer (adder), provide the intermediate signal based on the hear-through signal and/or the audio input signal. In one or more examples, the intermediate filter module is configured to mix, such as add or linearly combine, the hear-through signal and the audio input signal, e.g. for provision of a monitor input signal.

The audio device comprises a first mixer, e.g. for provision of an error signal based on the feed-back input signal and the intermediate signal. The first mixer may be an adder, subtractor or a linear combiner. In other words, the feed-back input signal and the intermediate signal may be input signals to the first mixer.

The audio device comprises a feed-back filter for provision of a feed-back output signal representative of noise sound picked up at the feed-back microphone. The feed-back output signal may be based on the error signal. In other words, the error signal from the first mixer may be fed as input to the feedback filter.

The audio device comprises a second mixer, e.g. for provision of an output signal based on the feed-forward output signal and/or the feed-back output signal. The second mixer may be an adder, subtractor or a linear combiner. In other words, the feed-forward output signal and/or the feed-back output signal may be input signals to the second mixer.

In one or more example audio devices, the audio device comprises an interface for provision of an audio input signal based on one or more audio signals received from an auxiliary device; a receiver for provision of an output sound into an ear canal of a user based on an audio output signal; a feed-forward microphone for provision of a feed-forward input signal based on ambient sound; a distributor for provision of a first feed-forward input signal and a second feed-forward input signal each based on the feed-forward input signal; a feed-back microphone for provision of a feed-back input signal based on the output sound and a noise sound in or at the ear canal of the user; a feed-forward filter for provision of a feed-forward output signal based on the first feed-forward input signal, wherein the feed-forward filter is representative of an acoustic signal path from the feed-forward microphone to the ear canal of the user; an intermediate filter module for provision of an intermediate signal representative of a desired sound to be reproduced by the receiver, wherein the intermediate filter module comprises a hear-through filter for provision of a hear-through signal based on the second feed-forward input signal and wherein the intermediate filter module is configured to provide the intermediate signal based on the hear-through signal and the audio input signal; a first mixer for provision of an error signal based on the feed-back input signal and the intermediate signal; a feed-back filter for provision of a feed-back output signal representative of noise sound picked up at the feed-back microphone, the feed-back output signal based on the error signal; and a second mixer for provision of the output signal based on the feed-forward output signal and the feed-back output signal.

When representative of the acoustic signal path from the feed-forward microphone to the ear canal of the user, the feed-forward filter enables the receiver to ideally provide in the output sound components that are equal—but in opposite phase—to ambient sound entering the ear canal of the user, and thereby enables the audio device to provide feed-forward noise cancellation, herein also called feed-forward cancellation, when the audio device is worn by the user in its intended position of use. Ambient sound may typically reach the user's ear canal e.g. through the structure of the audio device, through acoustic leaks between the audio device and the skin of the user, and/or through portions of the user's head.

The feed-forward filter may be designed and/or adaptively controlled to have a frequency response that enables effective feed-forward noise cancellation, preferably at least within a frequency range of 1 kHz to 2.5 kHz, or more preferably within a frequency range of 500 Hz to 5 kHz. In one or more example audio devices, the feed-forward filter may comprise a fixed filter with a frequency response determined during development or manufacturing of the audio device. In one or more example audio devices, the feed-forward filter may instead, or additionally, comprise an adaptive filter that is controlled to adapt the frequency response of the feed-forward filter to variations in the acoustic signal path. The design of such filters—and corresponding control algorithms—are known from the prior art within the field of feed-forward noise cancellation in audio devices, such as headsets. Such filters may be embodied e.g. as finite impulse response (FIR) filters or infinite impulse response (IIR) filters.

When providing the feed-back output signal to be representative of noise sound picked up at the feed-back microphone, the feed-back filter enables the receiver to ideally provide in the output sound components that are equal—but in opposite phase—to such noise sound, and thereby enable the audio device to provide feed-back noise cancellation, herein also called feed-back cancellation, when the audio device is worn by the user in its intended position of use.

The feed-back filter may be designed and/or controlled to have a frequency response that enables effective feed-back noise cancellation, preferably at least within a frequency range of 100 Hz to 500 Hz. In one or more example audio devices, the feed-back filter may comprise a fixed filter with a frequency response determined during development or manufacturing of the audio device. In one or more example audio devices, the feed-back filter may instead, or additionally, comprise an adaptive filter that is controlled to adapt the frequency response of the feed-back filter to variations in the acoustic signal path from the output of the receiver to the input of the feed-back microphone. The design of such filters—and corresponding control algorithms—are known from the prior art within the field of feed-back noise cancellation in audio devices, such as headsets. Such filters may be embodied e.g. as finite impulse response (FIR) filters, multi-rate FIR filters or infinite impulse response (IIR) filters. Preferably, the feed-back filter is designed to have a short delay to be able to provide effective feed-back noise cancellation also at higher frequencies, such as also in the frequency range 500 Hz to 1 kHz.

Preferably, the feed-back filter may be designed and/or controlled to have a frequency response that enables effective feed-back noise cancellation also at lower frequencies, such as also in the frequency range 50 Hz to 100 Hz. This may enable or enhance the ability of the audio device to provide active occlusion cancellation (AOC) that counteracts occlusion effects in the user's ear canal. In principle, AOC works like feed-back noise cancellation, but the target noise is different.

In one or more example audio devices, the feed-back filter comprises a feed-back controller that based on the error signal controls the frequency response of the feed-back filter to minimize the error signal. The feed-back filter may e.g. execute an optimization algorithm, such as the well-known least means squares (LMS) algorithm or one of its variants for this purpose. The intermediate signal is representative of the signal that the user is intended to hear, and in the ideal case wherein the error signal is zero, the sound picked up from the ear canal by the feed-back microphone equals the intermediate signal, thus indicating that the sound in the ear canal equals the intended sound.

The audio device may thus provide both feed-forward noise cancellation and feed-back noise cancellation, also known as hybrid noise cancellation. Typically, the feed-back noise cancellation will target noise that escapes the feed-forward noise cancellation.

In one or more example audio devices, the audio device can include one or more memories. A memory can be configured to store one or more of criteria, signals, schemes, parameters, coefficients, gains matrices, etc. The memory may be utilized by one or more modules of the audio device discussed herein. One or more modules discussed herein can utilize the memory for storage and/or retrieving of data. One or more modules discussed herein can be a portion of the memory.

In one or more example audio devices, the audio device can include one or more processors. The processor(s) can be configured to execute any of the operations discussed herein. One or more modules discussed herein can utilize the processor for operating. One or more modules discussed herein can be a portion of the processor. The processor may be a distributed processor. For example, one or more of feed-forward filter, intermediate filter module, feed-back filter, first mixer, second mixer, and third mixer discussed herein may be implemented in one or more processors.

In one or more example audio devices, the intermediate filter module comprises a monitor filter, e.g. for provision of the intermediate signal based on at least one of the hear-through signal and the audio input signal. In other words, the monitor filter may be fed with a monitor input signal based on the hear-through signal and/or the audio input signal. The monitor filter provides a monitor output signal by filtering the monitor input signal. The monitor output signal may constitute or at least form a part of the intermediate signal.

In one or more example audio devices, the monitor filter is designed to at least partly compensate for frequency dependencies in the signal path from the output of the monitor filter to the output of the receiver, such that the output sound from the receiver resembles the input to the monitor filter with minimum frequency coloration.

In one or more example audio devices, the intermediate filter module comprises a third mixer for mixing the hear-through signal and the audio input signal, e.g. for provision of a monitor input signal to the monitor filter. The monitor filter may be configured for provision of the intermediate signal based on the monitor input signal.

In one or more example audio devices, the monitor filter comprises a first monitor filter and a second monitor filter, wherein the first monitor filter is configured to filter the hear-through signal and the second monitor filter is configured to filter the audio input signal, and wherein the first monitor output signal from the first monitor filter and the second monitor output signal from the second monitor filter are fed as input to the third mixer. The first monitor filter and the hear-through filter may be integrated in a single filter.

The audio device may comprise a controller configured to control one or more processing modules, elements, and/or filters of the audio device. The controller may be connected to the interface, e.g. for receiving user control signals. Thus, in one or more example audio devices, the audio device comprises a controller configured to control one or more of the feed-forward filter, the intermediate filter module, and the feed-back filter, e.g. via respective feed-forward control signal, intermediate control signal, and feed-back control signal.

In one or more example audio devices, the controller is configured to control the hear-through filter of the intermediate filter module. In other words, the intermediate control signal may comprise a hear-through control signal fed to the hear-through filter. The controller may be configured to control the hear-through filter/intermediate filter module in accordance with a user input, e.g. via the interface, such as wireless transceiver or button/touch sensor.

In one or more example audio devices, the controller is configured to control the intermediate filter module to vary a relative level of ambient sound represented in the intermediate signal, e.g. such that the output sound provides a varying degree of hear-through of ambient sound to the user. The degree of hear-through of ambient sound may be characterized by the corresponding insertion gain in a first given frequency range, such as the frequency range from 300 Hz to 5 kHz, wherein the insertion gain is defined in the conventional way as the sound level difference at the ear drum caused by inserting the audio device into the ear. In other words, the filter coefficients and/or coefficients of the hear-through filter may be controlled to achieve a desired insertion gain for hear-through.

The controller may be configured to control the intermediate filter module, such as one or more gains and/or filter coefficients of the intermediate filter module, in accordance with a user input, e.g. via the interface, such as wireless transceiver or button/touch sensor.

In one or more example audio devices, the controller is configured to control a gain and/or filter coefficients of the feed-forward filter, such that the output sound provides a varying degree of feed-forward cancellation of ambient sound.

The degree of feed-forward cancellation of ambient sound may be characterized by the power of the noise in the ear canal that is cancelled by the feed-forward cancellation in a second given frequency range, such as in the frequency range from 500 Hz to 2,500 Hz, given a specific ambient noise scenario.

In the following, the degree of feed-forward cancellation of ambient sound is defined as a power level $P_F$ relative to the power level of the portion of noise in the ear canal in the second given frequency range that is cancelled by the feed-forward cancellation when the audio device is providing full or maximum feed-forward cancellation in a first ambient noise scenario with loud noise, such as e.g. exceeding normal speech levels, and with the feed-back cancellation and the hear-through turned off. When the audio device is providing full or maximum feed-forward cancellation in this situation, the degree of feed-forward cancellation of ambient sound $P_F$ would thus equal 0 dB. When the audio device is providing less than full or maximum feed-forward cancellation in this situation, the degree of feed-forward cancellation of ambient sound $P_F$ would be less than 0 dB.

The controller may be configured to control the feed-forward filter, such as one or more gains and/or filter coefficients of the feed-forward filter, in accordance with a user input, e.g. via the interface, such as wireless transceiver or button/touch sensor.

In one or more example audio devices, the controller is configured to control the intermediate filter module and/or the feed-forward filter, e.g. such that the degree of feed-forward cancellation of ambient sound $P_F$ decreases with increasing degree of hear-through of ambient sound.

In one or more example audio devices, the controller is configured to control a gain of the feed-back filter, such that the output sound provides a varying degree of feed-back cancellation of ambient sound to the user.

The degree of feed-back cancellation may be characterized by the power of the noise in the ear canal that is cancelled by the feed-back cancellation in a third given frequency range, such as in the frequency range from 100 Hz to 500 Hz, given a specific ambient noise scenario.

In the present context, the degree of feed-back cancellation of ambient sound is defined as a power level $P_B$ relative to the power level of the portion of noise in the ear canal in the third given frequency range that is cancelled by the feed-back cancellation when the audio device is providing full or maximum feed-back cancellation in the first ambient noise scenario, and with the feed-forward cancellation and the hear-through turned off. When the audio device is providing full or maximum feed-back cancellation in this situation, the degree of feed-back cancellation of ambient sound $P_B$ would thus equal 0 dB. When the audio device is providing less than full or maximum feed-back cancellation in this situation, the degree of feed-back cancellation of ambient sound $P_B$ would be less than dB.

Note that for any of feed-forward cancellation and feed-back cancellation, the respective given frequency range and/or the respective specific ambient noise scenario may be selected otherwise without substantially affecting the definition of respectively the degree of feed-forward cancellation of ambient sound P F and the degree of feed-back cancellation of ambient sound $P_B$, provided that a relatively wide frequency range, such as more than 20%, more than 30%, or more than 50% of the effective frequency range of respectively the feed-forward cancellation and the feed-back cancellation, and a relatively loud ambient noise scenario are selected.

The controller may be configured to control the feed-back filter, such as one or more gains and/or filter coefficients of the feed-back filter, in accordance with a user input, e.g. via the interface, such as wireless transceiver or button/touch sensor.

In one or more example audio devices, the controller is configured to control the intermediate filter module and/or the feed-back filter, e.g. such that the degree of feed-back cancellation of ambient sound $P_B$ decreases with increasing degree of hear-through of ambient sound.

In one or more example audio devices, the controller, in a first operating mode, is configured to control the feed-forward filter to provide a first degree of feed-forward cancellation $P_{F1}$, control the feed-back filter to provide a first degree of feed-back cancellation $P_{B1}$, and control the intermediate filter module to provide a first degree of hear-through of ambient sound. The first operating mode may be an ANC mode, i.e. a mode where the audio device provides ANC, such as full ANC or maximum ANC. The second operating mode may be a hear-through mode, i.e. a mode where the audio device provides hear-through, such as full hear-through or maximum hear-through.

The first degree of feed-forward cancellation $P_{F1}$ may correspond to a full, high or maximum degree of feed-forward cancellation of the ambient sound. For example, the first degree of feed-forward cancellation $P_{F1}$ may be larger than −3 dB, such as larger than −2 dB, e.g. larger than −1 dB and even about 0 dB.

The first degree of feed-back cancellation $P_{B1}$ may correspond to a full, high or maximum degree of feed-back cancellation of the noise in the ear canal. In other words, the first degree of feed-back cancellation of ambient sound $P_{B1}$ may be larger than −3 dB, such as larger than −2 dB, e.g. larger than −1 dB and even about 0 dB.

The first degree of hear-through of ambient sound may correspond to no or very low hear-through of ambient sound. Accordingly, the first degree of hear-through of ambient sound may be characterized by a low insertion gain, such as an insertion gain of less than −10 dB, such as less than −20 dB, e.g −30 dB. In other words, the first degree of hear-through of ambient sound may be characterized by little gain, very low gain or zero gain in the hear-through filter.

In one or more example audio devices, the controller, in a second operating mode, is configured to control the feed-forward filter to provide a second degree of feed-forward cancellation $P_{F2}$, control the feed-back filter to provide a second degree of feed-back cancellation $P_{B2}$, and control the intermediate filter module to provide a second degree of hear-through of ambient sound.

The second degree of feed-forward cancellation $P_{F2}$ may correspond to no, a low degree of, or a minimum degree of, feed-forward cancellation of the ambient sound. For example, the second degree of feed-forward cancellation $P_{F2}$ may be less than −3 dB, such as less than −6 dB, or event less than −10 dB, such as less than −20 dB. In one or more examples, the second degree of feed-forward cancellation $P_{F2}$ may be less than −30 dB.

The second degree of feed-back cancellation $P_{B2}$ may be characterized by no, a low degree of, or a minimum degree of, feed-back cancellation of the ambient sound in the feed-back filter. The second degree of feed-back cancellation $P_{B2}$ may correspond to no, a low degree of, or a minimum degree of, feed-back cancellation, and/or active occlusion cancellation (AOC), i.e. where the feed-back filter is configured to enable active occlusion/noise cancellation in a limited frequency range, e.g. up to 300 Hz.

For example, the second degree of feed-back cancellation $P_{B2}$ may be less than −3 dB, such as less than −6 dB, or event less than −10 dB, such as less than −20 dB. In one or more examples, the second degree of feed-back cancellation may be less than −30 dB.

The second degree of hear-through of ambient sound may be characterized by a high insertion gain, such as an insertion gain of more than −6 dB, such as more than −3 dB, e.g. dB. Thus, the second degree of hear-through of ambient sound may be characterized by full, high or maximum degree of hear-through of ambient sound. Ideally, an insertion gain of 0 dB (at all interesting frequencies) would provide natural hearing. The user may, however, want a larger or smaller gain than 0 dB depending on circumstances and preferences for hear-through. In one or more examples, the second degree of hear-through of ambient sound may be larger than the first degree of hear-through of ambient sound, i.e. ambient sound is represented to a larger extent in the audio output signal using the second degree of hear-through compared to using the first degree of hear-through.

In one or more example audio devices, the controller, in a third operating mode, is configured to control the feed-forward filter to provide a third degree of feed-forward cancellation $P_{F3}$, control the feed-back filter to provide a third degree of feed-back cancellation $P_{B3}$, and control the intermediate filter module to provide a third degree of hear-through of ambient sound.

The third degree of feed-forward cancellation $P_{F3}$ may be characterized by a medium feed-forward cancellation, e.g. by a third set of filter coefficients in the feed-forward filter that performs a feed-forward cancellation between the first degree of feed-forward cancellation $P_{F1}$ and the second degree of feed-forward cancellation $P_{F2}$. In other words, the third degree of feed-forward cancellation $P_{F3}$ may correspond to a medium degree of feed-forward cancellation of the ambient sound. To provide a third degree of feed-forward cancellation $P_{F3}$ may e.g. be done by using or applying a third broadband gain and/or a third set of filter coefficients in the feed-forward filter. For example, the third degree of feed-forward cancellation $P_{F3}$ may be in the range from −3 dB to −20 dB, such as in the range from −6 dB to −10 dB.

The third degree of feed-back cancellation $P_{B3}$ may be characterized by a medium feed-back cancellation e.g. by a third set of filter coefficients in the feed-back filter that performs a feed-back cancellation between the first degree of feed-back cancellation $P_{B1}$ and the second degree of feed-back cancellation $P_{B2}$. In other words, the third degree of feed-back cancellation $P_{B3}$ may correspond to a medium degree of feed-back cancellation. To provide a third degree of feed-back cancellation $P_{B3}$ may e.g. be done by using or applying a third broadband gain and/or a third set of filter coefficients in the feed-back filter. For example, the third degree of feed-back cancellation $P_{B3}$ may be in the range from −3 dB to −20 dB, such as in the range from −6 dB to −10 dB. The third degree of feed-back cancellation $P_{B3}$ may correspond to a feed-back cancellation between a full or maximum feed-back cancellation (first degree) and a feed-back cancellation with only AOC (second degree).

The third degree of hear-through of ambient sound may be characterized by a medium insertion gain. The third degree of hear-through of ambient sound may be characterized by an insertion gain less than −3 dB, such as less than −6 dB. The third degree of hear-through of ambient sound may be characterized by an insertion gain larger than −30 dB, such as larger than −20 dB, or even larger than −10 dB. In one or more example audio devices, the third degree of hear-through of ambient sound may be characterized by an insertion gain in the range from −20 dB to −3 dB, such as in the range from −10 dB to 6 dB. In one or more example audio devices, e.g. where the second degree of hear-through is characterized by an insertion gain larger than 1.5 dB, the third degree of hear-through of ambient sound may be characterized by an insertion gain in the range from −3 dB to −1.5 dB. The third degree of hear-through of ambient sound may be between the first degree of hear-through and the second degree of hear-through of ambient sound. The third degree of hear-through may be achieved by a third set of filter coefficients in the intermediate filter module, such as the hear-through filter, that causes medium or intermediate hear-through of the ambient sound. In other words, the third degree of hear-through of ambient sound may be characterized by gain(s) in the hear-through filter less than the gain(s) associated with the second degree of hear-through. Alternatively, or in addition, the third degree of hear-through of ambient sound may be characterized by gain(s) in the hear-through filter larger than the gain(s) associated with the first degree of hear-through. In one or more examples, the third degree of hear-through of ambient sound may be larger than the first degree of hear-through of ambient sound, i.e. ambient sound is represented to a larger extent in the audio output signal with the third degree of hear-through than with the first degree of hear-through. In one or more examples, the third degree of hear-through of ambient sound may be smaller than the second degree of hear-through of ambient sound, i.e. ambient sound is represented to a larger extent in the audio output signal with the second degree of hear-through than with the third degree of hear-through.

The degree of feed-forward cancellation $P_F$ may be controlled by adapting one or more filter coefficients and/or a broadband gain of the feed-forward filter.

The degree of feed-back cancellation $P_B$ may be controlled by adapting one or more filter coefficients and/or a broadband gain of the feed-back filter.

The degree of hear-through may be controlled by adapting one or more filter coefficients and/or a broadband gain of the hear-through filter.

Examples of filter settings for first operating mode OM_1, second operating mode OM_2, and third operating mode OM_3 are outlined in the table below.

| Filter settings | OM_1 (Max ANC) | OM_2 (Full hear-through (HT)) | OM_3 (Intermediate or medium ANC/HT) |
|---|---|---|---|
| Feed-forward filter | Full feed-forward cancellation Optimum gain for modelling feed-forward path | Off No feed-forward cancellation) | Adjustable between full feed-forward cancellation and off Intermediate broadband gain, e.g. 50% of broadband gain in full feed-forward cancellation |
| Intermediate filter module | Off No hear-through | "Natural hearing" Gain corresponding to insertion gain | Adjustable between off and "natural hearing" |
| Feed-back filter | Full feed-back cancellation, i.e. optimum gain for modelling feed-forward path effect | AOC only or off Active occlusion cancellation up to 300 HZ | Adjustable between full and AOC only |

In one or more example audio devices, the interface is configured to receive an external control signal, the interface connected to the controller for feeding the external control signal to the controller, wherein the controller is configured to control one or more of the feed-forward filter, the intermediate filter module, and the feed-back filter in accordance with the external control signal. The external control signal may be indicative of and/or in accordance with a user input, e.g. selecting an operating mode, such as one of first operating mode, second operating mode, and optionally third operating mode.

Also disclosed is a method of operating an audio device.

In one or more example methods, the method comprises obtaining a feed-forward input signal and a feed-back input signal; obtaining an audio input signal; distributing the feed-forward input signal for provision of a first feed-forward input signal and a second feed-forward input signal based on the feed-forward input signal; filtering the first feed-forward input signal for provision of a feed-forward output signal; processing the second feed-forward input signal and the audio input signal for provision of an intermediate signal; wherein processing the second feed-forward input signal and the audio input signal comprises filtering the second feed-forward input signal for provision of a second feed-forward output signal and providing the intermediate signal based on the second feed-forward output signal and the audio input signal; mixing the feed-back input signal and the intermediate signal for provision of a an error signal; filtering the error signal for provision of a feed-back output signal; mixing the feed-forward output signal and the feed-back output signal for provision of an audio output signal; and providing an output sound based on the audio output signal.

It is noted that descriptions and features of audio device functionality also apply to methods of operating an audio device and vice versa. For example, a description of a filter and the corresponding filter functionality also applies to a method of operating a hearing device, wherein the method comprises filtering, and vice versa. The audio device disclosed herein may be configured to perform any of the methods herein.

FIG. 1 discloses an example audio device 10 according to the disclosure. The audio device 10 comprises an interface 12 for provision of an audio input signal 12A based on one or more audio signals received from an auxiliary device; a receiver 16 for provision of an output sound into an ear canal of a user based on an audio output signal 18; a feed-forward microphone 20 for provision of a feed-forward input signal 20A based on ambient sound; a distributor 22 for provision of a first feed-forward input signal 20B and a second feed-forward input signal 20C each based on such as being a copy of the feed-forward input signal 20A; a feed-back microphone 24 for provision of a feed-back input signal 24A based on the output sound and a noise sound in or at the ear canal of the user; and a feed-forward filter 26 for provision of a feed-forward output signal 26A based on, e.g. by filtering, the first feed-forward input signal 20B. The feed-forward filter 26 is representative of an acoustic signal path from the feed-forward microphone 20 to the ear canal of the user.

The audio device 10 comprises an intermediate filter module 28 for provision of an intermediate signal 28A, e.g. representative of a desired sound to be reproduced by the receiver, wherein the intermediate filter module 28 comprises a hear-through filter 30 for provision of a hear-through signal 30A based on, e.g. by filtering, the second feed-forward input signal 20C. The intermediate filter module 28 is configured to provide the intermediate signal 28A based on the hear-through signal 30A and the audio input signal 12A as explained in further detail below.

The audio device 10 comprises a first mixer 32 for provision of an error signal 32A based on the feed-back input signal 24A and the intermediate signal 28A, the error signal 32A being calculated as a difference between the feed-back input signal 24A and the intermediate signal 28A. In other words, the first mixer 32 may be a subtractor.

The audio device 10 comprises a feed-back filter 34 for provision of a feed-back output signal 34A, e.g. representative of noise sound picked up at the feed-back microphone, the feed-back output signal 34A based on, e.g. by filtering, the error signal 32A.

The audio device 10 comprises a second mixer 36 for provision of an output signal 36A based on, e.g. by adding or linearly combining, the feed-forward output signal 26A and the feed-back output signal 34A. The output signal 36 is used as the audio output signal 18 fed to the receiver.

It is to be appreciated that the output signal from microphones 20, 24 may be subject to pre-processing and/or ADC (not shown) for provision of respective input signals 20A, 24A. Further, output signal 36A may be subject to DAC and/or post-processing (not shown) for provision of the audio output signal 18 fed to the receiver.

The intermediate filter module 28 comprises a monitor filter 38 for provision of the intermediate signal 28A based on the hear-through signal and the audio input signal by filtering a monitor input signal 40A for provision of monitor output signal 38A as the intermediate signal 28A. The intermediate filter module 28 comprises a third mixer 40 for mixing, e.g. adding or linearly combining, the hear-through signal 30A and the audio input signal 12A for provision of the monitor input signal 40A to the monitor filter 38. The monitor filter 38 is configured for provision of the monitor output signal 38A/intermediate signal 28A based on the monitor input signal 40A by filtering the monitor input signal 40A.

The audio device 10 comprises a controller 42 configured to control one or more of the feed-forward filter 26, the intermediate filter module 28, and the feed-back filter 34 via respective feed-forward control signal 42B, intermediate control signal 42A, and feed-back control signal 42C.

The controller 42 is configured to control the intermediate filter module 28, such as the hear-through filter 30, e.g. one or more gains and/of filter coefficients of the hear-through filter, via the intermediate control signal 42A. For example, the controller may be configured to control the intermediate filter module 28 to vary a relative level of ambient sound represented in the intermediate signal 28A, e.g. such that the output sound provides a varying degree of hear-through of ambient sound to the user.

The controller 42 is configured to control the feed-forward filter 26, such as one or more gains and/of filter coefficients of the feed-forward filter 26, via the feed-forward control signal 42B. For example, the controller 42 may be configured to control a gain of the feed-forward filter such that the output sound provides a varying degree of feed-forward cancellation of ambient sound to the user $P_F$. For example, the gain of the feed-forward filter 26 may be lowered in response to user input indicating a desire to increase hear-through.

The controller 42 may be configured to control the intermediate filter module 28 and the feed-forward filter 26 such that the degree of feed-forward cancellation of ambient sound $P_F$ decreases with increasing degree of hear-through of ambient sound.

The controller 42 is configured to control the feed-back filter 34, such as one or more gains and/of filter coefficients of the feed-back filter 34, via the feed-back control signal 42C. For example, the controller 42 may be configured to control a gain or gains of the feed-back filter 34 such that the output sound provides a varying degree of feed-back cancellation of ambient sound $P_B$ to the user.

The controller 42 may be configured to control the intermediate filter module 28 and the feed-back filter 34 such that the degree of feed-back cancellation of ambient sound $P_B$ decreases with increasing degree of hear-through of ambient sound. For example, the gain of the feed-back filter 34 may be lowered in response to user input indicating a desire to increase hear-through.

The controller 42 may, e.g. in a first operating mode, be configured to control the feed-forward filter 26 to provide a first degree of feed-forward cancellation $P_{F1}$, control the feed-back filter 34 to provide a first degree of feed-back cancellation $P_B$, and control the intermediate filter module 28 to provide a first degree of hear-through. The first operating mode may be an operating mode characterized by a high, large or maximum degree of active noise cancellation also denoted ANC.

In the audio device 10, the first degree of feed-forward cancellation $P_{F1}$ may be achieved by a first set of filter coefficients and/or first broadband gain in the feed-forward filter. The first degree of feed-forward cancellation $P_{F1}$ may correspond to a full, high or maximum degree of feed-forward cancellation of the ambient sound. For example, the first degree of feed-forward cancellation may be larger than −3 dB.

In the audio device 10, the first degree of feed-back cancellation $P_{B1}$ may correspond to a full, high or maximum degree of feed-back cancellation. For example, the first degree of feed-back cancellation $P_{B1}$ may be larger than −3 dB.

In the audio device 10, the first degree of hear-through of ambient sound as controlled by controller 42 may be characterized by a low insertion gain, such as an insertion gain of less than −10 dB, such as less than −20 dB, e.g. −30 dB. In other words, the first degree of hear-through of ambient sound may be characterized by little, very low gain or zero gain in the hear-through filter 30.

The controller 42 may, e.g. in a second operating mode, be configured to control the feed-forward filter to provide a second degree of feed-forward cancellation $P_{F2}$, control the feed-back filter to provide a second degree of feed-back cancellation $P_{B2}$, and control the intermediate filter module to provide a second degree of hear-through. The second degree of hear-through may be larger than the first degree of hear-through. The second operating mode may be a hear-through mode, e.g. an operating mode characterized by a high, large or maximum degree of hear-through.

In the audio device 10, the second degree of feed-forward cancellation $P_{F2}$ may be achieved by a second set of filter coefficients and/or second broadband gain in the feed-forward filter. The second degree of feed-forward cancellation $P_{F2}$ may correspond to a low, minimum, or no degree of feed-forward cancellation of the ambient sound. For example, the second degree of feed-forward cancellation $P_{F2}$ may be less than −6 dB, such as less than −10 dB.

In the audio device 10, the second degree of feed-back cancellation $P_{B2}$ may be achieved by a second set of filter coefficients and/or second broadband gain in the feed-back filter. The second degree of feed-back cancellation $P_{B2}$ may correspond to a low, minimum, or no degree of feed-back cancellation. For example, the second degree of feed-back cancellation $P_{B2}$ may be less than −6 dB, such as less than −10 dB.

In the audio device 10, the second degree of hear-through of ambient sound as controlled by controller 42 may be characterized by a high insertion gain, such as an insertion gain of more than −6 dB, such as more than −3 dB, e.g. about 0 dB.

The controller 42 may, e.g. in a third operating mode, be configured to control the feed-forward filter to provide a third degree of feed-forward cancellation $P_{F3}$, control the feed-back filter to provide a third degree of feed-back cancellation $P_{B3}$, and control the intermediate filter module to provide a third degree of hear-through. The third degree of hear-through may be smaller than the second degree of hear-through. The third operating mode may be an intermediate mode between the first operating mode, e.g. with maximum ANC where no or heavily reduced ambient sound is output to the user, and the second operating mode, e.g. being a hear-through mode, where all or large parts of the ambient sound is output to the user. In other words, the third operating mode may be characterized by a combination of ANC and hear-through.

In the audio device 10, the third degree of feed-forward cancellation $P_{F3}$ may be achieved by a third set of filter coefficients and/or third broadband gain in the feed-forward filter. The third degree of feed-forward cancellation $P_{F3}$ may correspond to a medium or intermediate degree of feed-forward cancellation of the ambient sound. For example, the third degree of feed-forward cancellation $P_{F3}$ may be in the range from −20 dB to −3 dB, such as in the range from −6 dB to −10 dB.

In the audio device 10, the third degree of feed-back cancellation $P_{B3}$ may be achieved by a third set of filter coefficients and/or third broadband gain in the feed-back filter. The third degree of feed-back cancellation $P_{B3}$ may correspond to a medium or intermediate degree of feed-back cancellation of the ambient sound. For example, the third degree of feed-back cancellation $P_{B3}$ may be in the range from −20 dB to −3 dB, such as in the range from −6 dB to −10 dB.

In the audio device 10, the third degree of hear-through of ambient sound as controlled by controller 42 may be characterized by a medium or intermediate insertion gain, such as an insertion gain in the range from −20 dB to −3 dB, e.g. in the range from −10 dB to −6 dB.

The interface 12 may be connected to the controller 42, and the interface 12 may be configured to receive and feed an external control signal 42D to the controller 42. The controller 42 is configured to control one or more of the feed-forward filter 26, the intermediate filter module 28, and the feed-back filter 34 in accordance with the external control signal 42D. The external control signal 42D may be indicative of a change in operating mode, such as a change from the first operating mode to the second operating mode or the third operating mode, a change from the second operating mode to the first operating mode or the third operating mode, or a change from the third operating mode to the first operating mode or the second operating mode.

Figure 2:
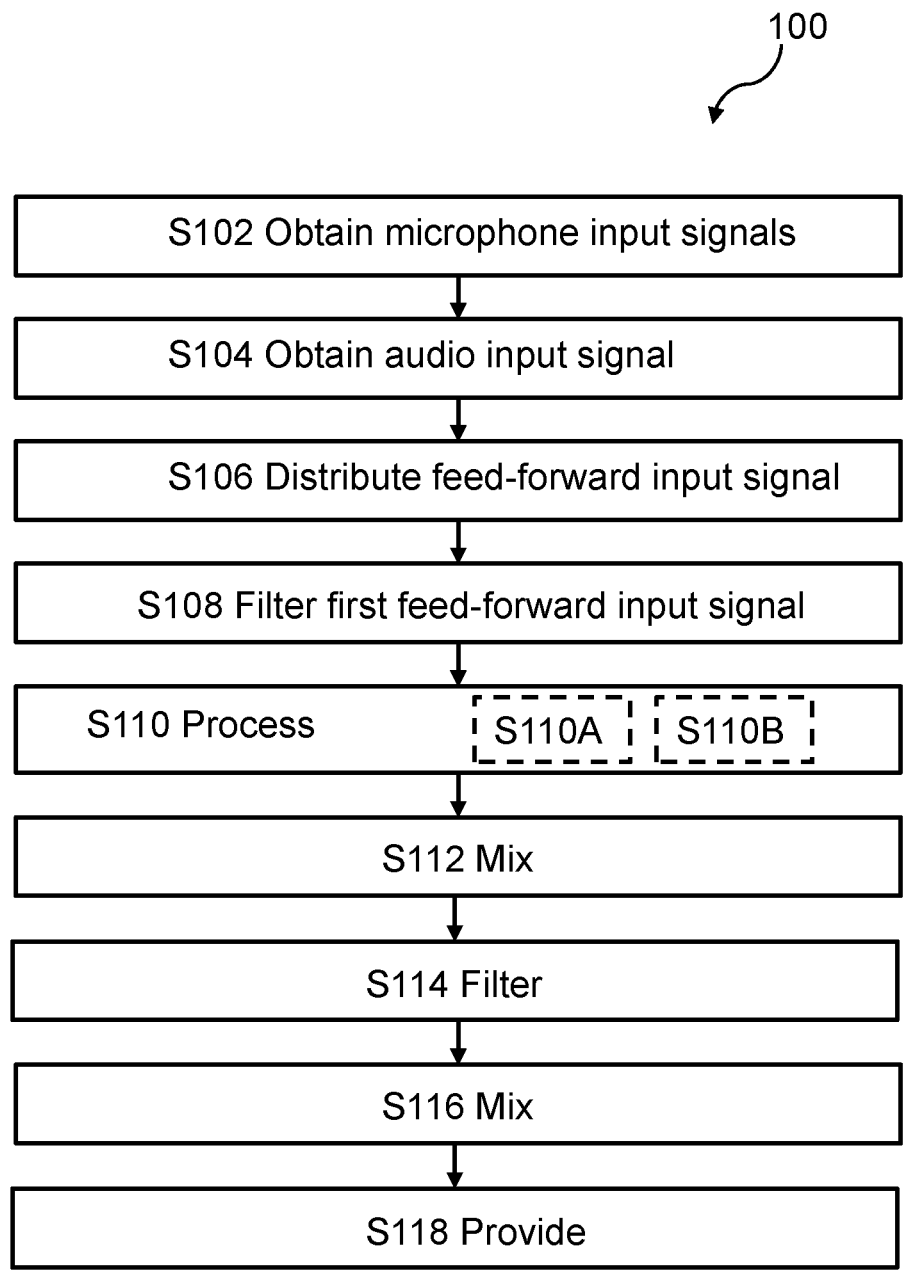
FIG. 2 illustrates a flow chart of an example method according to the disclosure.

FIG. 2 schematically illustrates a flow diagram of an exemplary method according to the disclosure. The method 100 is a method of operating an audio device, the method 100 comprising obtaining S102, e.g. with feed-forward microphone, a feed-forward input signal and, e.g. with feed-back microphone, a feed-back input signal; obtaining S104, e.g. using interface, an audio input signal; distributing S106 the feed-forward input signal for provision of a first feed-forward input signal and a second feed-forward input signal based on the feed-forward input signal; filtering S108 the first feed-forward input signal for provision of a feed-forward output signal; processing S110 the second feed-forward input signal and the audio input signal for provision of an intermediate signal; wherein processing the second feed-forward input signal and the audio input signal comprises filtering S110A the second feed-forward input signal for provision of a second feed-forward output signal and providing S110B the intermediate signal based on the second feed-forward output signal and the audio input signal; mixing S112 the feed-back input signal and the intermediate signal for provision of a an error signal; filtering S114 the error signal for provision of a feed-back output signal; mixing S116 the feed-forward output signal and the feed-back output signal for provision of an audio output signal; and providing S118 an output sound based on the audio output signal.

It may be appreciated that the figures comprise some modules or operations which are illustrated with a solid line and some modules or operations which are illustrated with a dashed line. The modules or operations which are comprised in a solid line are modules or operations which are comprised in the broadest example embodiment. The modules or operations which are comprised in a dashed line are example embodiments which may be comprised in, or a part of, or are further modules or operations which may be taken in addition to the modules or operations of the solid line example embodiments. It should be appreciated that these operations need not be performed in the order presented. Furthermore, it should be appreciated that not all of the operations need to be performed. The exemplary operations may be performed in any order and in any combination.

It is to be noted that the word "comprising" does not necessarily exclude the presence of other elements or steps than those listed.

It is to be noted that the words "a" or "an" preceding an element do not exclude the presence of a plurality of such elements.

It should further be noted that any reference signs do not limit the scope of the claims, that the exemplary embodiments may be implemented at least in part by means of both hardware and software, and that several "means", "units" or "devices" may be represented by the same item of hardware.

The various exemplary methods, modules, devices, and systems described herein are described in the general context of method steps processes, which may be implemented in one aspect by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Generally, program modules may include routines, programs, objects, components, data structures, etc. that perform specified tasks or implement specific abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

Although features have been shown and described, it will be understood that they are not intended to limit the claimed invention, and it will be made obvious to those skilled in the art that various changes and modifications may be made without departing from the spirit and scope of the claimed invention. The specification and drawings are, accordingly to be regarded in an illustrative rather than restrictive sense. The claimed invention is intended to cover all alternatives, modifications, and equivalents.

LIST OF REFERENCES 10 audio device
12 interface
12A audio input signal
12B wireless transceiver
12C button
16 receiver
18 audio output signal
20 feed-forward microphone 20A feed-forward input signal
20B first feed-forward input signal
20C second feed-forward input signal
22 distributor
24 feed-back microphone
24A feed-back input signal
26 feed-forward filter
26A feed-forward output signal
28 intermediate filter module
28A intermediate signal
30 hear-through filter
30A hear-through signal
32 first mixer
32A error signal
34 feed-back filter
34A feed-back output signal
36 second mixer
36A output signal
38 monitor filter
38A monitor output signal
40 third mixer
40A monitor input signal
42 controller
42A intermediate control signal
42B feed-forward control signal
42C feed-back control signal
42D external control signal
100 method of operating an audio device
S102 obtaining a feed-forward input signal and a feed-back input signal
S104 obtaining an audio input signal
S106 distributing the feed-forward input signal for provision of a first feed-forward input signal and a second feed-forward input signal based on the feed-forward input signal
S108 filtering the first feed-forward input signal for provision of a feed-forward output signal
S110 processing the second feed-forward input signal and the audio input signal for provision of an intermediate signal
S110A filtering the second feed-forward input signal for provision of a second feed-forward output signal
S110B providing the intermediate signal based on the second feed-forward output signal and the audio input signal
S112 mixing the feed-back input signal and the intermediate signal for provision of a an error signal
S114 filtering the error signal for provision of a feed-back output signal
S116 mixing the feed-forward output signal and the feed-back output signal for provision of the output signal
S118 providing an output sound based on the audio output signal

The invention claimed is:

1. An audio device comprising:
an interface for provision of an audio input signal based on one or more audio signals received from an auxiliary device;
a receiver for provision of an output sound into an ear canal of a user based on an audio output signal;
a feed-forward microphone for provision of a feed-forward input signal based on ambient sound;
a distributor for provision of a first feed-forward input signal and a second feed-forward input signal each based on the feed-forward input signal;
a feed-back microphone for provision of a feed-back input signal based on the output sound and a noise sound in or at the ear canal of the user;
a feed-forward filter for provision of a feed-forward output signal based on the first feed-forward input signal, wherein the feed-forward filter is representative of an acoustic signal path from the feed-forward microphone to the ear canal of the user;
an intermediate filter module for provision of an intermediate signal representative of a desired sound to be reproduced by the receiver, wherein the intermediate filter module comprises a hear-through filter for provision of a hear-through signal based on the second feed-forward input signal and wherein the intermediate filter module is configured to provide the intermediate signal based on the hear-through signal and the audio input signal;
a first mixer for provision of an error signal based on the feed-back input signal and the intermediate signal;
a feed-back filter for provision of a feed-back output signal representative of noise sound picked up at the feed-back microphone, the feed-back output signal based on the error signal; and
a second mixer for provision of the audio output signal based on the feed-forward output signal and the feed-back output signal.

2. The audio device according to claim 1, wherein the intermediate filter module comprises a monitor filter for provision of the intermediate signal based on at least one of the hear-through signal and the audio input signal.

3. The audio device according to claim 2, the intermediate filter module comprising a third mixer for mixing the hear-through signal and the audio input signal for provision of a monitor input signal to the monitor filter, wherein the monitor filter is configured for provision of the intermediate signal based on the monitor input signal.

4. The audio device according to claim 1, the audio device comprising a controller configured to control one or more of the feed-forward filter, the intermediate filter module, and the feed-back filter.

5. The audio device according to claim 4, wherein the controller is configured to control the hear-through filter of the intermediate filter module.

6. The audio device according to claim 4, wherein the controller is configured to control the intermediate filter module to vary a relative level of ambient sound represented in the intermediate signal such that the output sound provides a varying degree of hear-through of ambient sound to the user.

7. The audio device according to claim 6, wherein the controller is configured to control a gain of the feed-forward filter such that the output sound provides a varying degree of feed-forward cancellation of ambient sound to the user.

8. The audio device according to claim 7, wherein the controller is configured to control the intermediate filter module and the feed-forward filter such that the degree of feed-forward cancellation of ambient sound decreases with increasing degree of hear-through of ambient sound.

9. The audio device according to claim 6, wherein the controller is configured to control a gain of the feed-back filter such that the output sound provides a varying degree of feed-back cancellation of ambient sound to the user.

10. The audio device according to claim 9, wherein the controller is configured to control the intermediate filter module and the feed-back filter such that the degree of feed-back cancellation of ambient sound decreases with increasing degree of hear-through of ambient sound.

11. The audio device according to claim 4, wherein the controller, in a first operating mode, is configured to control the feed-forward filter to provide a first degree of feed-forward cancellation, control the feed-back filter to provide a first degree of feed-back cancellation, and control the intermediate filter module to provide a first degree of hear-through of ambient sound.

12. The audio device according to claim 4, wherein the controller, in a second operating mode, is configured to control the feed-forward filter to provide a second degree of feed-forward cancellation, control the feed-back filter to provide a second degree of feed-back cancellation, and control the intermediate filter module to provide a second degree of hear-through of ambient sound, and wherein the second degree of hear-through of ambient sound is larger than the first degree of hear-through of ambient sound.

13. The audio device according to claim 12, wherein the controller, in a third operating mode, is configured to control the feed-forward filter to provide a third degree of feed-forward cancellation, control the feed-back filter to provide a third degree of feed-back cancellation, and control the intermediate filter module to provide a third degree of hear-through of ambient sound, and wherein the third degree of hear-through of ambient sound is smaller than the second degree of hear-through of ambient sound and larger than the first degree of hear-through of ambient sound.

14. The audio device according to claim 4, wherein the interface is configured to receive an external control signal, the interface connected to the controller for feeding the external control signal to the controller, wherein the controller is configured to control one or more of the feed-forward filter, the intermediate filter module, and the feed-back filter in accordance with the external control signal.

15. A method of operating an audio device, the method comprising:
    obtaining a feed-forward input signal and a feed-back input signal;
    obtaining an audio input signal;
    distributing the feed-forward input signal for provision of a first feed-forward input signal and a second feed-forward input signal based on the feed-forward input signal;
    filtering the first feed-forward input signal for provision of a feed-forward output signal;
    processing the second feed-forward input signal and the audio input signal for provision of an intermediate signal; wherein processing the second feed-forward input signal and the audio input signal comprises filtering the second feed-forward input signal for provision of a second feed-forward output signal and providing the intermediate signal based on the second feed-forward output signal and the audio input signal;
    mixing the feed-back input signal and the intermediate signal for provision of an error signal;
    filtering the error signal for provision of a feed-back output signal;
    mixing the feed-forward output signal and the feed-back output signal for provision of an audio output signal; and
    providing an output sound based on the audio output signal.

* * * * *